(12) United States Patent
Campana-Schmitt et al.

(10) Patent No.: US 6,521,302 B1
(45) Date of Patent: Feb. 18, 2003

(54) METHOD OF REDUCING PLASMA-INDUCED DAMAGE

(75) Inventors: Francimar Campana-Schmitt, Milpitas, CA (US); Carsten Schimanke, Be Jihmegen (NL)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/670,483

(22) Filed: Sep. 26, 2000

(51) Int. Cl.⁷ .................................................. H05H 1/02
(52) U.S. Cl. ............. 427/574; 427/255.18; 427/255.29; 427/255.37; 427/255.395; 427/578; 427/579
(58) Field of Search ................ 427/255.18, 255.29, 427/255.37, 255.395, 570, 574, 578, 579

(56) References Cited

U.S. PATENT DOCUMENTS

| | | | |
|---|---|---|---|
| 5,271,972 A | * 12/1993 | Kwok et al. ................ 427/579 |
| 6,072,227 A | 6/2000 | Yau et al. .................... 257/642 |
| 6,159,871 A | 12/2000 | Loboda et al. .............. 438/786 |

\* cited by examiner

*Primary Examiner*—Bernard Pianalto
(74) *Attorney, Agent, or Firm*—Moser, Patterson & Sheridan

(57) ABSTRACT

A method of reducing plasma-induced damage in a substrate, comprising providing a post-deposition ramp down of a plasma source power used in generating a plasma for substrate processing.

7 Claims, 3 Drawing Sheets

US 6,521,302 B1

METHOD OF REDUCING PLASMA-INDUCED DAMAGE

BACKGROUND OF THE DISCLOSURE

1. Field of the Invention

The invention relates to a method and apparatus of reducing plasma-induced damage in a substrate.

2. Background of the Invention

In the manufacture of integrated circuits, plasma processes are often used for deposition or etching of various material layers. Plasma processing offers many advantages over thermal processing. For example, plasma enhanced chemical vapor deposition (PECVD) allows deposition to be achieved at a lower temperature than that required in an analogous thermal process. This is advantageous for processes with stringent thermal budget demands, e.g., in very large scale or ultra-large scale integrated circuit (VLSI or ULSI) device fabrication.

It has been known in the art that device damage may occur as a result of plasma processing, including deposition and etch processes. Typically, the susceptibility or degree of device damage depends on the stage of device fabrication and the specific device design. For example, a substrate with a relatively large antenna ratio (e.g., area of metal interconnect to area of gate) is more susceptible to gate oxide damage compared to one with a smaller antenna ratio, because of an increased charging effect. A substrate that has an insulating layer deposited thereon is also more susceptible to damage due to the accumulation of surface charges, and a buildup of potential gradients. Other plasma related effects, such as plasma non-uniformity, may give rise to electric field gradients that lead to device damage. Therefore, there is an ongoing need for methods and apparatus to reduce plasma-induced damage in a substrate.

SUMMARY OF THE INVENTION

Embodiments of the invention generally provide a method and apparatus for reducing plasma-induced damage by implementing a post-deposition ramp down of a plasma source power used for plasma generation. The ramp down of the plasma source power may be achieved by reducing the power to one or more intermediate levels in multiple steps, or in a continuous manner.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Overview

The invention provides a method of plasma processing that reduces plasma-induced damage on a substrate. In general, one or more different effects may contribute to plasma-induced damage. For example, device damage may occur due to a large electrical field gradient arising from sudden or abrupt changes in plasma source power, or may result from charges that have accumulated on the substrate during plasma processing. According to embodiments of the invention, plasma-induced damage is reduced by different combinations of post-deposition steps that provide a gradual change in the substrate's environment after plasma processing—e.g., by a gradual termination of plasma source power or a gradual dissipation of surface charges through changing the process gas flows.

Figure 1:
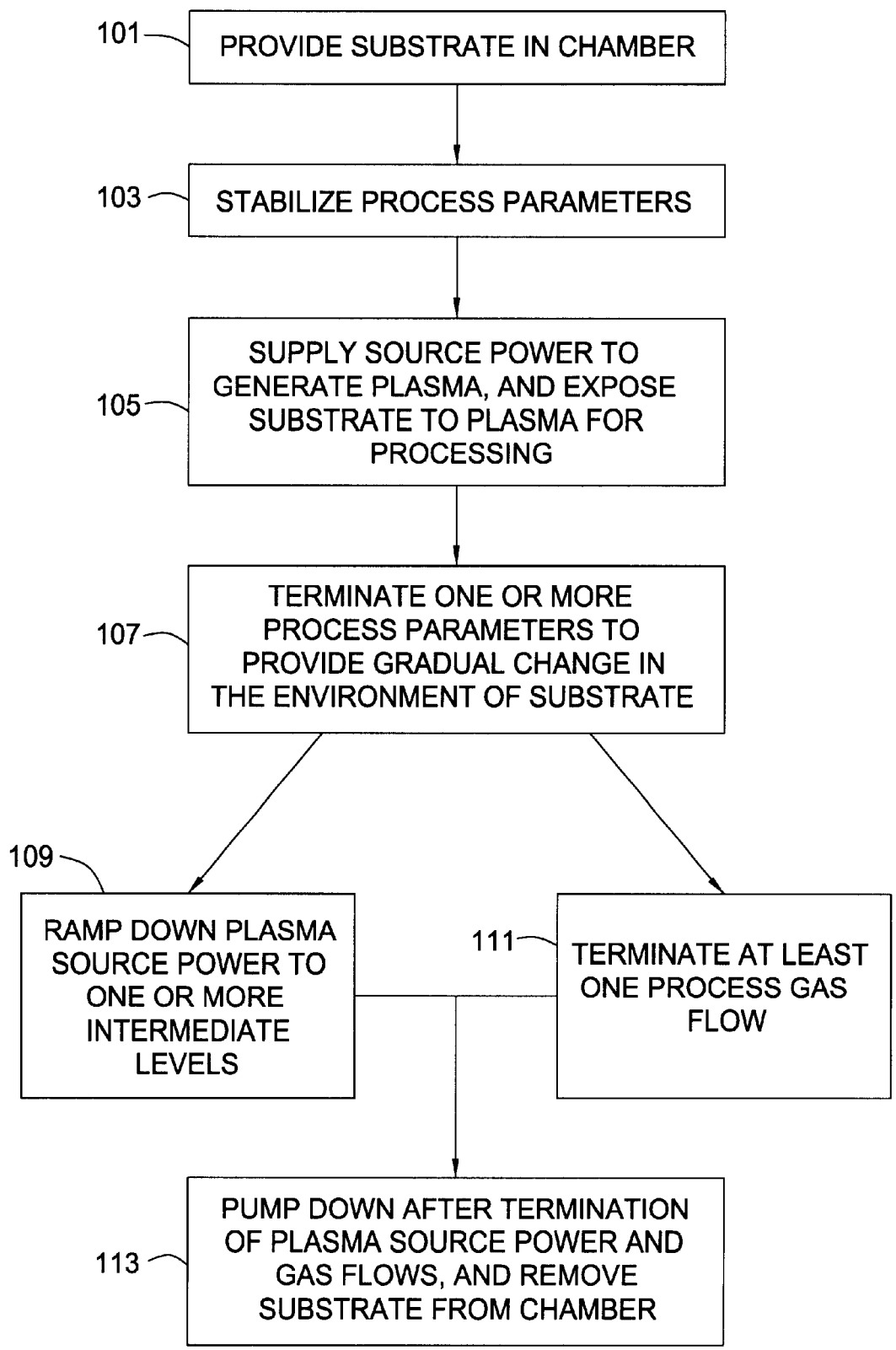
FIG. 1 is a process flow diagram illustrating a method incorporating embodiments of the invention.

FIG. 1 is a process flow diagram illustrating a method of plasma processing incorporating embodiments of the invention. In step 101, a substrate is positioned in a chamber for plasma processing. One or more stabilization steps may be performed, as shown in step 103, to allow for stabilization of various process parameters such as gas flow and chamber pressure. In step 105, a plasma is generated by supplying a plasma source power to an electrode, and the substrate is subjected to plasma processing, e.g., deposition or etching.

After the deposition step 105, one or more of the process parameters, e.g., plasma source power or a process gas flow, is terminated in a manner that results in a relatively gradual change in the environment of the substrate, as illustrated in step 107.

In one aspect of the invention, a method comprises ramping down a plasma power after the completion of a plasma process. That is, the plasma power is reduced to one or more intermediate levels as a function of time, as opposed to a sudden and complete power termination as practiced in conventional processes. As shown in step 109, the power ramp down procedure may be implemented in discrete steps, i.e., with the plasma power set at several intermediate levels for certain time durations, or in a continuous manner as a function of time. The power ramp down provides a gradual change in the plasma environment around the substrate, which helps minimize substrate damage due to plasma-induced effects.

In another aspect of the invention, shown in step 111, electrical charges that may have accumulated on the substrate surface are also allowed to gradually dissipate, e.g., by changing the process gas flows. Thus, although step 109 may be performed by itself, it may also be performed, in other embodiments, in conjunction with step 111, either sequentially or simultaneously with each other. In step 111, for example, the process gas flows may be changed by terminating one or more process gases that may contribute to charge buildup. These two aspects of the invention may be implemented either concurrently or sequentially with each other, and specific parameter selections may vary according to the susceptibility to device damage, device designs or the specific stage of fabrication. Finally, as shown in step 113, after the complete termination of the plasma source power and process gas flows (not shown in figure), the substrate and the chamber are subjected to a pump down, and the substrate is removed from the chamber.

The concepts embodied in this invention are generally applicable to various plasma processes, including deposition and etching, and may be practiced in a variety of plasma processing systems. Embodiments are described below in reference to oxide deposition for illustrative purposes.

Apparatus

Figure 2:
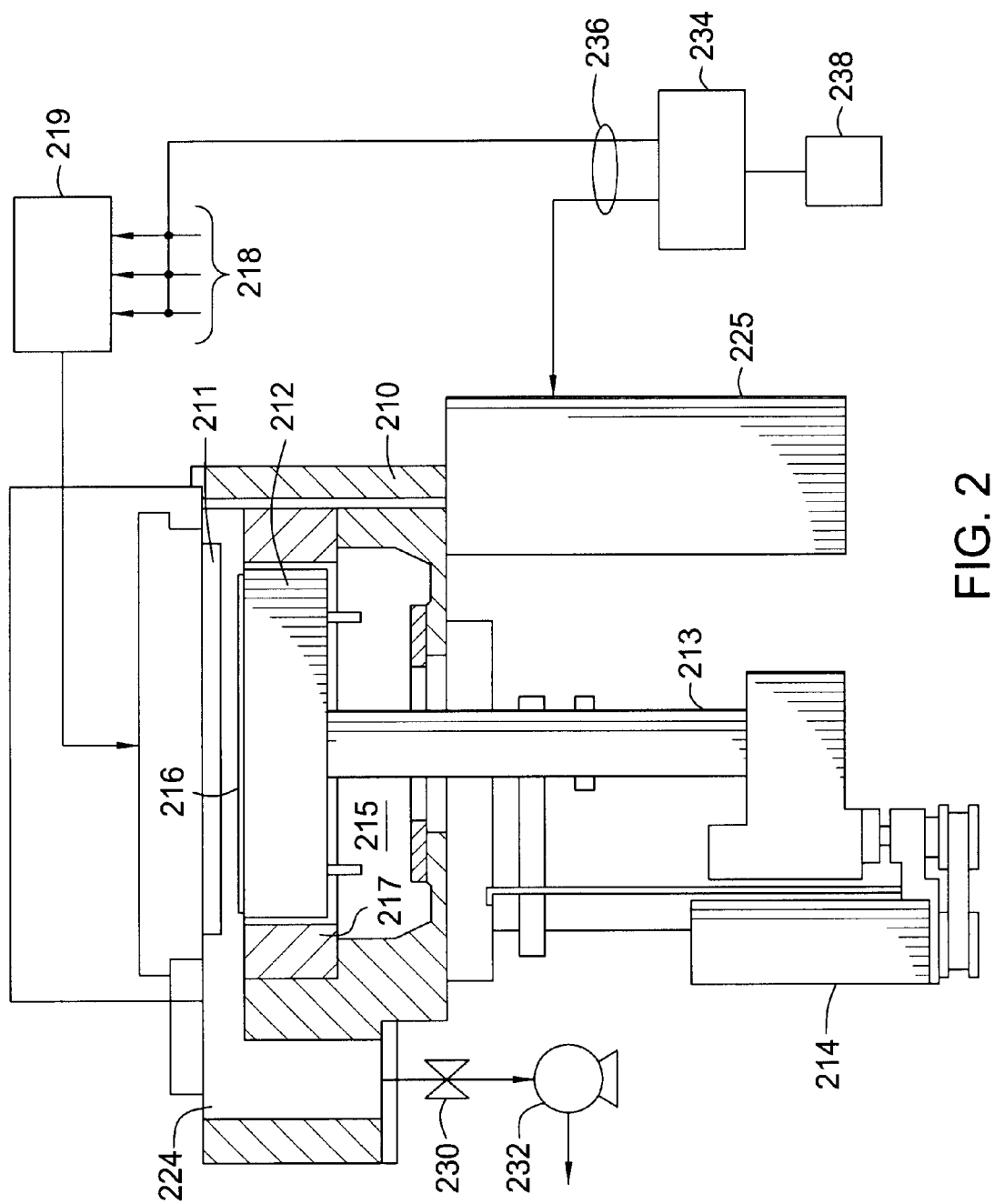
FIG. 2 is a schematic representation of an apparatus that is suitable for practicing embodiments of the invention.

FIG. 2 is a cross-sectional schematic view of a chemical vapor deposition (CVD) chamber 210 that is suitable for practicing embodiments of the invention. One example of such a chamber 210 is a DxZ™ chamber used with a CENTURA® platform or in a PRODUCER™ system (with dual chambers), both of which are available from Applied Materials, Inc., of Santa Clara, Calif. Both film deposition and plasma treatment of deposited films can be performed in a DxZ CVD chamber.

The process chamber 210 contains a gas distribution manifold 211, typically referred to as a "showerhead", for dispersing process gases through perforated holes (not shown) in the manifold 211 to a substrate 216 that rests on a substrate support 212. Gas flow controllers 219 are typically used to control and regulate the flow rates of different process gases into the process chamber 210 through the gas distribution manifold 211. Other flow control components may include a liquid flow injection valve and liquid flow controller (not shown) if liquid precursors are used. The substrate support 212 is resistively heated and is mounted on a support stem 213, so that the substrate support 212 and the substrate 216 can be controllably moved by a lift motor 214 between a lower loading/off-loading position and an upper processing position adjacent to the gas distribution manifold 211. When the substrate support 212 and the substrate 216 are in the processing position, they are surrounded by an insulator ring 217.

During processing, process gases are uniformly distributed radially across the substrate surface. The gases are exhausted through a port 224 by a vacuum pump system 232, with the gas throughput or chamber pressure being regulated by a throttle valve 230. A plasma is formed from one or more process gas or a gas mixture by applying radio-frequency (RF) energy from a RF power supply 225 to the gas distribution manifold 211, which acts as an electrode. Film deposition takes place when the substrate 216 is exposed to the plasma and the reactive gases provided therein. The substrate support 212 and chamber walls are typically grounded. The RF power supply 225 can supply either a single or mixed-frequency RF signal to the gas distribution manifold 211 to enhance the decomposition of any gases introduced into the chamber 210. When a single frequency RF signal is used, e.g., between about 350 kHz and about 60 MHz, a power between about 1 and about 200 W can be applied to the gas distribution manifold 211, which acts as an electrode.

A system controller 234 controls the functions of various components such as the power supplies, lift motors, flow controllers for gas injection, vacuum pump, and other associated chamber and/or processing functions. The system controller 234 executes system control software stored in a memory 238, which in the preferred embodiment is a hard disk drive, and can include analog and digital input/output boards, interface boards, and stepper motor controller boards. Optical and/or magnetic sensors are generally used to move and determine the position of movable mechanical assemblies. An example of such a CVD process chamber is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention. This patent is incorporated herein by reference.

The above CVD system description is mainly for illustrative purposes, and other plasma equipment, including other plasma sources, may also be employed for practicing embodiments of the invention.

Process

For illustrative purposes, embodiments of the invention will be discussed with respect to a plasma oxide deposition process. In one embodiment, tetraethoxy-silane (TEOS) is used as a precursor for oxide deposition. Other precursors, e.g., silane, organosilanes (methyl, dimethyl or trimethyl silanes and so on) and tetramethyl cyclotetra-siloxane (TMCTS), may also be used in various reactions with an oxygen-containing gas, e.g., nitrous oxide ($N_2O$), oxygen ($O_2$) or ozone ($O_3$), for oxide deposition. It is further understood that the invention is generally applicable to many other plasma processes, such as deposition of other materials, including insulating, conductive or semiconducting layers, during various stages of device fabrication.

Figure 3A:
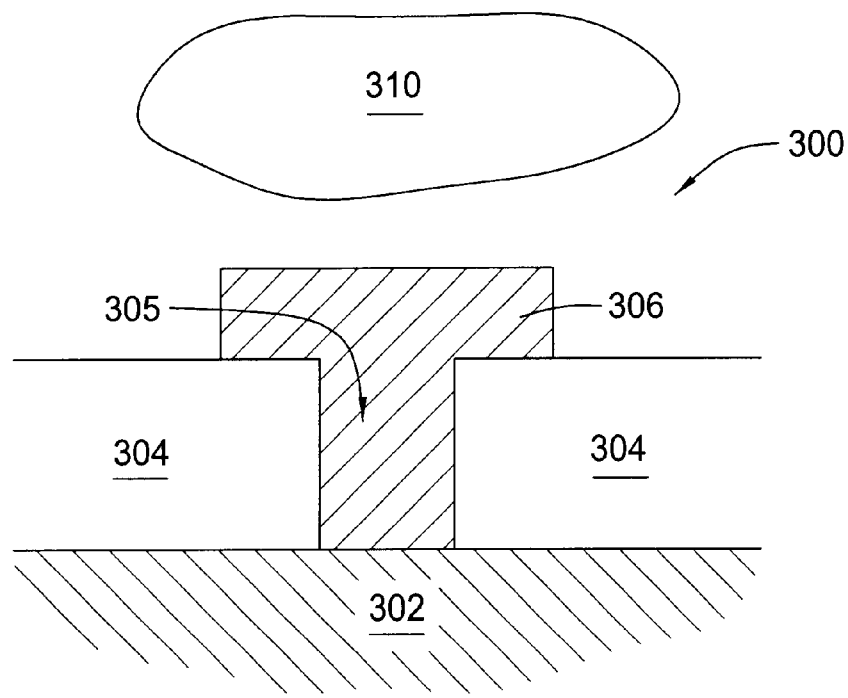
FIGS. 3a–3b illustrate schematic partial sectional views of a substrate undergoing plasma processing.
Figure 3B:
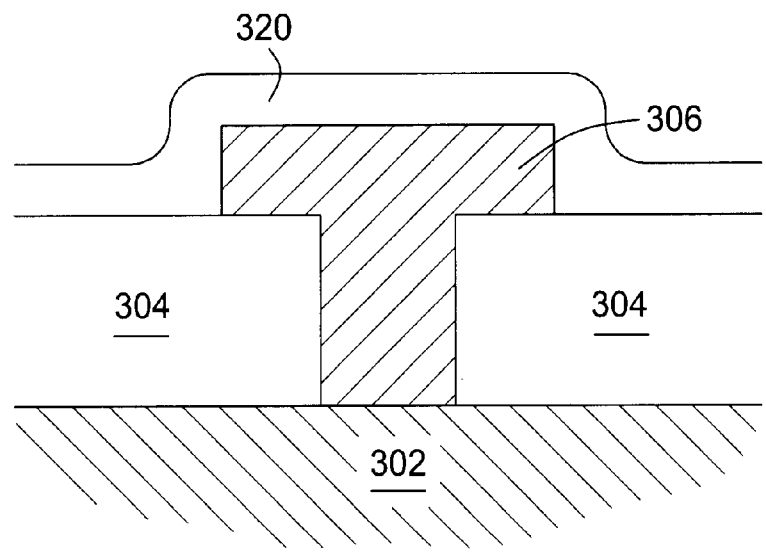

FIGS. 3a–3b illustrate partial sectional views of a substrate undergoing a plasma TEOS deposition process. For example, the plasma TEOS deposition may be used in different stages of integrated circuit fabrication, e.g., for forming a dielectric layer between gate and a first level metal, or as an interlevel dielectric. FIG. 3a shows a substrate 300 being exposed to a plasma 310 generated from a process gas composition comprising TEOS. The substrate 300 generally comprises one of more material layers (including conductive, insulating or semiconducting materials) formed during the fabrication of an integrated circuit device. For example, FIG. 3a shows the substrate 300 comprising a feature 306, e.g., a metal line, that has been formed over an insulating layer 304 and filling an opening 305 that extends to an underlying layer 302. The metal feature 306 may, for example, comprise aluminum (Al) or other suitable metals, while the opening 305 may be a contact or via. The underlying layer 302 typically comprises a conductive or semiconductive material, e.g., various metals or silicon, or compounds thereof. The plasma 310 is typically characterized by various process parameters, such as flow rates of the process gases, RF power supplied to the electrode, temperature of the substrate, and pressure in the chamber, among others. Some exemplary process parameters suitable for plasma TEOS oxide deposition is given in Table 1.

TABLE 1

| | Range | Preferred |
|---|---|---|
| TEOS flow rate (mg/min) | 500–4000 | 1000 |
| $O_2$ flow rate (sccm) | 500–6000 | 1000 |
| He flow rate (sccm) | 500–6000 | 1000 |
| Pressure (Torr) | 3–20 | 8 |
| Temperature (° C.) | 350–450 | 400 |
| RF power (W) | 400–1500 | 950 |

Oxide deposition using the parameters of Table 1 can be performed in a DxZ chamber, such as that illustrated in FIG. 2, or other appropriate deposition chambers. It is understood that the specific parameters disclosed herein are primarily for illustrative purposes, and other preferred operating parameters and/or ranges may be adjusted according to different chamber configurations and processing requirements.

The process gas composition is typically a gas mixture comprising TEOS or other suitable oxide precursor, and may contain one or more carrier or dilutant gases. Since TEOS is a liquid at room temperature, a liquid injection valve, which is heated to some elevated temperature, is used to introduce TEOS vapor into the gas manifold. The TEOS vapor is then mixed with a carrier gas, such as helium (He), and introduced to the process chamber. For example, with the injection valve temperature at about 100° C., a TEOS flow rate of about 1000 mg/min. may be introduced into the chamber. In general, a TEOS flow rate between about 500 and about 4000 mg/min. may be used, with a higher injection temperature required to attain a higher flow rate. The carrier gas (He) is provided at a flow rate between about 500 and about 6000 sccm, preferably about 1000 sccm.

In this embodiment, the process gas mixture further comprises a reactant gas, such as an oxygen-containing gas, to react with TEOS for oxide deposition. For example, the oxygen-containing gas may be oxygen ($O_2$). The $O_2$ flow rate is preferably about 1000 sccm, but a range between about 500 and about 6000 sccm may also be used. Typically, a total pressure is maintained between about 3 and about 20 Torr, preferably at about 8 Torr. The plasma 310 is generated by applying a RF power between about 400 and about 1500 W, preferably about 950 W, to the gas manifold, at a heater temperature between about 350 and about 450° C., e.g., about 400° C. In general, a lower process temperature is usually preferred due to thermal constraint considerations. Using the plasma TEOS recipe, an oxide layer 320 can be deposited on the substrate 300, as shown in FIG. 3b.

The plasma TEOS deposition is typically implemented by executing a process recipe that has been stored in the memory of the controller of the chamber. A process recipe usually comprises a multi-step sequence, which may include pre-deposition steps used for stabilization of various process parameters, one or more deposition steps, and post-deposition steps for film treatment, purging or pumping, among others.

According to embodiments of the invention, upon the completion of the oxide deposition step in the process recipe, the RF plasma power is ramped down in a gradual manner, as opposed to a sudden termination of RF power that is usually practiced in conventional processes. Table 2 illustrates a recipe comprising a process sequence according to one embodiment of the invention.

TABLE 2

|  | 1 STAB | 2 STAB | 3 DEP | 4 RAMP DOWN | 5 PUMP |
|---|---|---|---|---|---|
| TEOS (mg/min.) | 0 | 1000 | 1000 | 0 | 0 |
| $O_2$ (sccm) | 1000 | 1000 | 1000 | 1000 | — |
| He (sccm) | 1000 | 1000 | 1000 | 1000 | — |
| Pressure (Torr) | — | 8 | 8 | 8 | — |
| RF power (W) | 0 | 0 | 950 | 300 | 0 |

Prior to oxide deposition, process gas flows and chamber pressure are established and allowed to stabilize. For example, after $O_2$ and He gas flows are stabilized at about 1000 sccm during a first step, a TEOS flow of about 1000 mg/min. is added and the chamber pressure is stabilized at about 8 Torr in a second step. In step 3, a plasma is generated from the process gas mixture at a RF power of about 950 W. In this example, an oxide layer can be deposited on the substrate at a rate of greater than about 7500 Å/minute.

When oxide deposition is complete, the RF power is reduced in ramp down step 4, with the substrate (e.g., wafer) remaining on the substrate support. In one embodiment, the RF power is reduced to a level of about one third of the plasma deposition level in step 4, e.g., about 300 W, during which the TEOS flow into the chamber is also terminated. The $O_2$ and He gas flows and the chamber pressure are maintained at about the same level as in the deposition step. The heater temperature is also maintained at about 400° C. throughout the process recipe, but it is possible that the wafer temperature may experience a slight decrease, e.g., due to reduced plasma heating. Under this condition, the RF power is sufficient to sustain a weak plasma. In one embodiment, the RF power ramp down step lasts for about 10 seconds before a subsequent pump down step 5.

Depending on the specific application, the time duration and the intermediate RF power level of the ramp down step may be adjusted, as appropriate. For example, the intermediate RF power level may be maintained at about half, or between one half and one quarter, of the power used for oxide deposition. It is believed that, during the ramp down step, it may be desirable to maintain the RF power at an intermediate level sufficiently high to sustain a plasma under the specific pressure and gas flow conditions. For example, a plasma formed from the mixture of $O_2$ and He (without TEOS flow) may provide effective post-deposition treatment or annealing of the oxide layer, resulting in defect reduction in the substrate. Furthermore, other time durations or intervals may be used for the ramp down step, e.g., a shorter time may be desirable for improving process throughput, as long as the duration is effective in avoiding or minimizing undesirable wafer damage. Typically, a time duration between about 5 and about 30 seconds is sufficient to provide a substrate that is relatively free from plasma-induced damage, without adversely impacting on process throughput.

After the ramp down step, all remaining process gas flows are terminated and the RF power is reduced to zero in the pump down step 5. During the pump down, a throttle valve to the pump is fully open, and residual process gases are pumped out from all the gas lines within the gas manifold. Subsequently, the substrate with the deposited oxide layer is removed from the chamber, prior to the introduction of another substrate.

In another embodiment, the RF power is terminated after oxide deposition by providing multiple ramp down steps, during which the RF power is reduced successively to various intermediate levels. In one example, the RF power termination may be achieved via eight successive ramp down steps, e.g., with intermediate RF power levels at about 800, 700, 600, 500, 400, 300, 200 and 100 V, respectively. During each of these discrete ramp down steps, the $O_2$ and He gas flows, along with the chamber pressure and heater temperature, are maintained at substantially the same settings as in the deposition step and the RF power is maintained at each intermediate level for a certain time interval or duration. Similar to the recipe of Table 2, the TEOS flow is terminated in the first ramp down step, concurrent with the initiation of the power ramp down. In this embodiment, each of the discrete ramp down steps lasts for about 0.5 second, although other time intervals, e.g., between about 0.1 and about 30 seconds, or more preferably, between about 0.1 and about 10 seconds, may also be used.

In general, different combinations of the number of ramp down steps, time intervals and intermediate power levels used in each step may be used in practicing the invention. For example, the power level may be decreased in approximately equal intervals in successive steps, or may be decreased by approximately 50% in each successive step; and other combinations, including unequal time intervals, are also possible. For larger RF power level decrements, a longer time interval for each step may be preferable, while for smaller RF power decrements, a shorter time interval may be sufficient. Depending on the specific power ramp down sequence, the time intervals may range from about 0.1 to about 30 seconds, or from about 0.1 to about 10 seconds. Various factors such as the susceptibility of device damage and process throughput, among others, are relevant considerations in the selection of these parameters.

In yet another embodiment, the RF power ramp down procedure may be implemented in a continuous manner. Unlike previous embodiments using discrete ramp down steps, a continuous ramp down procedure involves reducing the RF power from an operating power level to zero without maintaining the power at an intermediate level for any appreciable time interval or duration. For example, the software routine may be pre-programmed such that, upon the execution of a power termination step in the process recipe, the RF power is decreased to zero within a desired time duration, e.g., between about 5 and about 30 seconds, or between about 5 and about 10 seconds, at a constant ramp down rate.

Devices fabricated using embodiments of the invention show considerable improvement in reduced surface charge compared to those processed using conventional recipes. For example, wafers having about 1000 Å of TEOS oxide layer deposited over silicon are measured for surface charge distribution. Wafers processed using conventional recipes show a minimum surface potential of about +0.1 V and a maximum of about +35 V, resulting in about 35 V in potential difference in the wafer. In general, a potential of less than about 2 V is desired, in order to avoid charge-induced damage. Wafers processed according to embodiments of the invention exhibit considerable improvement in the surface potential, e.g., a minimum potential of about −6 V and a maximum of about 2 V, resulting in a potential difference of about 8 V.

In the embodiments described above, RF power termination via an intermediate ramp down step is performed concurrently with (e.g., within the same recipe step) the termination of TEOS flow. However, other variations incorporating different combinations or sequences of RF power termination and TEOS termination procedures are also possible. For example, substrate damage may be reduced by terminating at least the TEOS flow in a separate post-deposition step, while maintaining the $O_2$ and/or He gas flows and pressure, prior to implementing the RF power ramp down procedures previously described. An example of such a termination sequence is illustrated in Table 3, in which the TEOS flow is terminated in step 4, while keeping the RF power at the deposition power level. The RF power is then ramped down in step 5 to an intermediate level, e.g., about 300 W. Typically, the time durations of the TEOS termination and RF power ramp down steps may be about the same as or less than that used in the ramp down step of Table 2. Again, the selection of time durations is often based on considerations of effective damage reduction without significant compromise in process throughput.

TABLE 3

|  | 1 STAB PUMP | 2 STAB | 3 DEP | 4 TEOS OFF | 5 RAMP DOWN | 6 |
| --- | --- | --- | --- | --- | --- | --- |
| TEOS (mg/min.) | 0 | 1000 | 1000 | 0 | 0 | 0 |
| $O_2$ (sccm) | 1000 | 1000 | 1000 | 1000 | 1000 | — |
| He (sccm) | 1000 | 1000 | 1000 | 1000 | 1000 | — |
| Pressure (Torr) | — | 8 | 8 | 8 | 8 | — |
| RF power (W) | 0 | 0 | 950 | 950 | 300 | 0 |

It is also possible that the TEOS termination step be performed after the initiation of the power ramp down procedure—e.g., between two power ramp down steps within a multiple ramp down step sequence, or during continuous RF ramp down.

It is believed that the $O_2$ and/or He gas flows, in the absence of TEOS, may be effective in minimizing substrate damage because the gas flow treatment allows a gradual dissipation of surface charges, which tend to be enhanced by the presence of hydrogen on the deposited oxide layer (e.g., arising from TEOS). Thus, by providing the treatment with $O_2$ and/or He and terminating the TEOS flow, along with power ramp down, plasma-induced damage can be minimized or avoided. It is also possible that a different gas composition, e.g., argon (Ar), nitrogen ($N_2$), $O_2$, He and different combinations thereof, or one that helps remove hydrogen or otherwise facilitates charge dissipation, be used in this post-deposition treatment. However, it is generally preferred to maintain the treatment gas composition as similar to that in the deposition step.

Although several preferred embodiments which incorporate the teachings of the present invention have been shown and described in detail, those skilled in the art can readily devise many other varied embodiments that still incorporate these teachings. For example, it is understood that the specific process parameters and chambers cited herein are meant for illustrative purposes. As such, the intermediate power levels and time intervals used for the plasma power ramp down procedure, as well as other process parameters, may be adjusted according to specific application needs and/or chamber configurations.

What is claimed is:

1. A method of plasma processing, comprising the steps of:

(a) positioning a substrate in a chamber;

(b) flowing one or more process gases into the chamber;

(c) igniting a plasma from the one or more process gases by applying a plasma source power at a first power level;

(d) depositing a material layer on the substrate;

(e) ramping down the plasma source power below the first power level;

(f) terminating at least one gas flow from the one or more process gases prior to terminating the plasma, wherein the at least one gas flow comprises a precursor gas for the deposited material, wherein the precursor gas is selected from the group of tetraethoxy-silane and tetramethyl cyclotetra-siloxane, wherein the deposited material is oxide, and wherein the ramping down of the plasma source power is performed concurrently with the terminating at least one gas flow from the one or more process gases; and (g) terminating the plasma.

2. The method of claim 1, wherein the one or more process gases further comprise oxygen and an inert gas.

3. A method of plasma processing, comprising the steps of:

(a) positioning a substrate in a chamber;

(b) flowing one or more process gases into the chamber;

(c) igniting a plasma from the one or more process gases by applying a plasma source power at a first power level;

(d) depositing a material layer on the substrate;

(e) ramping down the plasma source power below the first power level;

(f) terminating at least one gas flow from the one or more process gases prior to terminating the plasma, wherein the at least one gas flow comprises a precursor gas for the deposited material, wherein the precursor gas is selected from the group of tetraethoxy-silane and tetramethyl cyclotetra-siloxane, wherein the deposited material is oxide, and wherein the ramping down of the plasma source power is performed sequentially with the terminating at least one gas flow from the one or more process gases; and (g) terminating the plasma.

4. The method claim 3, wherein the one or more process gases further comprise oxygen and an inert gas.

5. A method of oxide deposition, comprising the steps of:

(a) positioning a substrate in a chamber;

(b) flowing a process gas mixture comprising tetraethoxy-silane, oxygen and helium, to the chamber;

(c) forming a first plasma from the process gas mixture by applying a radio-frequency (RF) signal at a first power level;

(d) depositing an oxide layer on the substrate by exposing the substrate to the first plasma;

(e) ramping down the RF signal below the first power level;

(f) terminating the flow of tetraethoxy-silane; and (g) reducing the RF signal to zero after the terminating the flow of tetraethoxy-silane.

6. The method of claim 5, wherein the ramping down of the RF signal comprises reducing the RF signal to one or more intermediate power levels, and wherein each of the one or more intermediate power levels is maintained for a time interval between about 0.1 and about 30 seconds.

7. The method of claim 5, wherein the ramping down of the RF signal comprises reducing the RF signal in a continuous manner.

* * * * *